United States Patent
Chen

(10) Patent No.: US 11,256,300 B2
(45) Date of Patent: Feb. 22, 2022

(54) ELECTRONIC EQUIPMENT, SYSTEM FOR PROTECTING ELECTRONIC EQUIPMENT, METHOD FOR CONTROLLING ELECTRONIC EQUIPMENT, AND STORAGE MEDIUM

(71) Applicant: BEIJING XIAOMI MOBILE SOFTWARE CO., LTD., Beijing (CN)

(72) Inventor: Chaoxi Chen, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 99 days.

(21) Appl. No.: 16/745,486

(22) Filed: Jan. 17, 2020

(65) Prior Publication Data

US 2021/0109571 A1    Apr. 15, 2021

(30) Foreign Application Priority Data

Oct. 10, 2019    (CN) .......................... 201910960120.9

(51) Int. Cl.
*G05B 13/02*    (2006.01)
*G06F 1/16*    (2006.01)
*G01R 33/00*    (2006.01)
*G01R 33/06*    (2006.01)
*G05B 19/042*    (2006.01)

(52) U.S. Cl.
CPC ....... *G06F 1/1677* (2013.01); *G01R 33/0094* (2013.01); *G01R 33/06* (2013.01); *G05B 19/042* (2013.01); *G06F 1/1656* (2013.01); *G05B 2219/25464* (2013.01); *G06F 1/1626* (2013.01)

(58) Field of Classification Search
CPC .... G01R 33/06; G01R 33/093; G01R 33/098; G06F 1/1677; G06F 1/3206
See application file for complete search history.

(56) References Cited

U.S. PATENT DOCUMENTS

| | | | |
|---|---|---|---|
| 2006/0105757 A1* | 5/2006 | Kang .................... | G06F 1/1624 455/418 |
| 2007/0089311 A1 | 4/2007 | Amundson et al. | |
| 2014/0071608 A1* | 3/2014 | Masaoka ............... | G06F 1/1677 361/679.26 |
| 2018/0314316 A1* | 11/2018 | Xu ........................ | G01R 33/098 |
| 2020/0378799 A1* | 12/2020 | McGraw .................. | G01D 5/16 |

OTHER PUBLICATIONS

Extended European Search Report dated Aug. 18, 2020 in corresponding European Patent Application No. 201589579, 9 pages

* cited by examiner

*Primary Examiner* — Zhipeng Wang
(74) *Attorney, Agent, or Firm* — Oblon, McClelland, Maier & Neustadt, L.L.P.

(57) ABSTRACT

Electronic equipment can include an equipment body and a magnetic sensor apparatus assembled to the equipment body. The magnetic sensor apparatus can be provided with at least two magnetic field detectors. Any two magnetic field detectors sense a magnetic field respectively in two different sensing directions. A control circuit sends a sensor signal to a motherboard only when each magnetic field detector senses, in a respective sensing direction, external magnetic induction of no less than a respective preset threshold corresponding to the each magnetic field detector. The motherboard sends a control signal to control the equipment body according to the sensor signal.

10 Claims, 8 Drawing Sheets

ELECTRONIC EQUIPMENT, SYSTEM FOR PROTECTING ELECTRONIC EQUIPMENT, METHOD FOR CONTROLLING ELECTRONIC EQUIPMENT, AND STORAGE MEDIUM

CROSS-REFERENCE TO RELATED APPLICATIONS

This application is based on, and claims benefit of priority to, Chinese Application No. 201910960120.9 filed on Oct. 10, 2019. Disclosure of the Chinese Application is hereby incorporated by reference in its entirety.

BACKGROUND

Electronic equipment, such as a mobile phone or a tablet, may be provided with a magnetic sensor apparatus. The magnetic sensor apparatus can monitor information on an external magnetic field in a designated direction and perform a smart trigger of a related function of the electronic equipment. However, a magnetic sensor apparatus that monitors information on a magnetic field in a single direction can be susceptible to interference from an internal magnetic field, an external magnetic field, and the like, leading to an inadvertent trigger of a related function of the electronic equipment.

Electronic equipment may be equipped with a protective case. A magnet can be provided on the protective case. Smart lighting-up and/or turning-off of a screen of the electronic equipment may be implemented using a change in a magnetic field sensed by a magnetic sensor apparatus at opening and/or closing of the protective case. Complexity of the change in the magnetic field at opening and/or closing of the protective case may cause a misjudgment by the magnetic sensor apparatus, which often causes an inadvertent trigger of a screen of the electronic equipment.

SUMMARY

The subject disclosure relates to the field of electronics, and in particular to electronic equipment, a system for protecting electronic equipment, a method for controlling electronic equipment, and a storage medium.

According to an aspect of the subject disclosure, electronic equipment includes an equipment body and a magnetic sensor apparatus assembled to the equipment body. The magnetic sensor apparatus can include a control circuit and at least two magnetic field detectors that can sense a magnetic field respectively in two sensing directions differing from one another.

The control circuit can be conductively connected to a motherboard of the equipment body. The control circuit sends a sensor signal to the motherboard in response to determining that external magnetic induction sensed by each of the at least two magnetic field detectors is no less than a preset threshold corresponding to the each of the at least two magnetic field detectors. The motherboard sends a control signal to control the equipment body according to the sensor signal.

A method for controlling electronic equipment is provided according to an aspect of the subject disclosure. The electronic equipment includes an equipment body and a magnetic sensor apparatus assembled to the equipment body. The magnetic sensor apparatus includes a control circuit and at least two magnetic field detectors. Any two of the at least two magnetic field detectors can sense a magnetic field respectively in two sensing directions differing from one another. The control circuit is conductively connected to a motherboard of the equipment body.

The method can include sending, by the control circuit, a sensor signal to the motherboard in response to determining that external magnetic induction sensed by each of the at least two magnetic field detectors is no less than a preset threshold corresponding to the each of the at least two magnetic field detectors, and sending, by the motherboard, a control signal to control the equipment body according to the sensor signal.

According to an aspect of the subject disclosure, a non-transitory computer-readable storage medium has stored thereon instructions that, when executed by a processor, cause the processor to implement a method for controlling electronic equipment. The electronic equipment includes an equipment body and a magnetic sensor apparatus assembled to the equipment body. The magnetic sensor apparatus can include a control circuit and at least two magnetic field detectors. Any two of the at least two magnetic field detectors sense a magnetic field respectively in two sensing directions differing from one another. The control circuit is conductively connected to a motherboard of the equipment body.

The method can include sending, by the control circuit, a sensor signal to the motherboard in response to determining that external magnetic induction sensed by each of the at least two magnetic field detectors is no less than a preset threshold corresponding to the each of the at least two magnetic field detectors, and sending, by the motherboard, a control signal to control the equipment body according to the sensor signal.

The above general description and elaboration below are but exemplary and explanatory, and do not limit the subject disclosure.

BRIEF DESCRIPTION OF THE DRAWINGS

Drawings here are incorporated in and constitute part of the subject specification, illustrate embodiments according to the subject disclosure, and together with the subject specification, serve to explain the principle of the subject disclosure.

DETAILED DESCRIPTION

Figure 1:
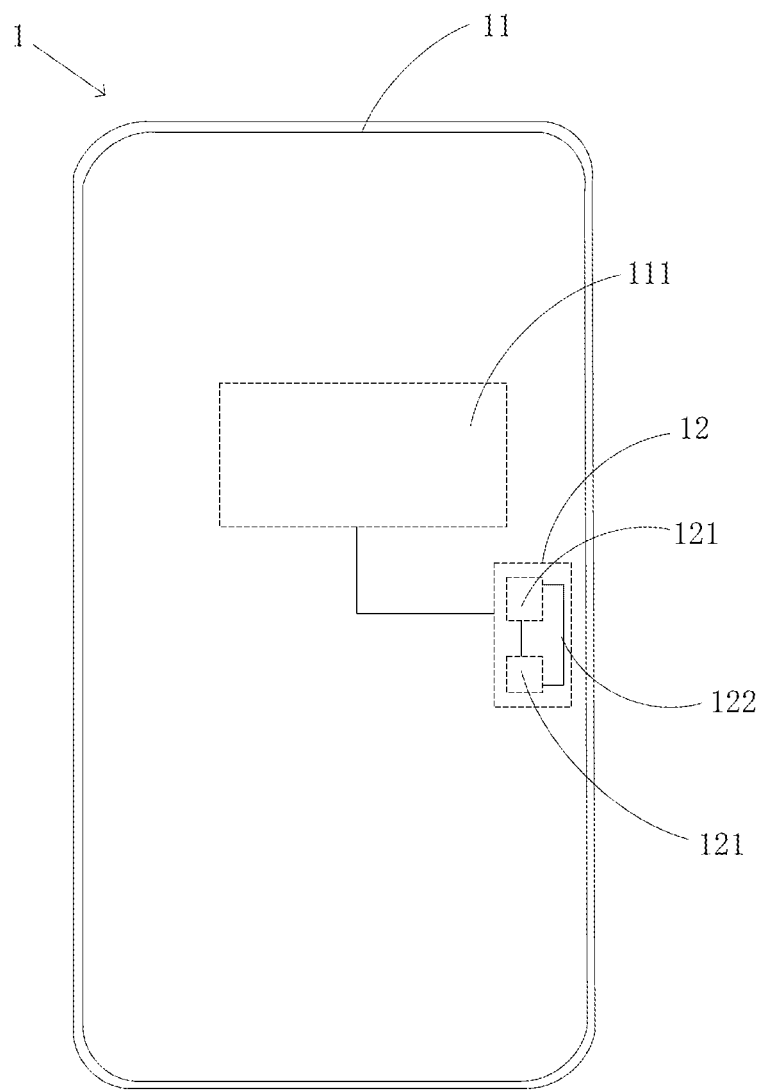
FIG. 1 is a diagram of a structure of electronic equipment according to an exemplary embodiment herein.
Figure 2A:
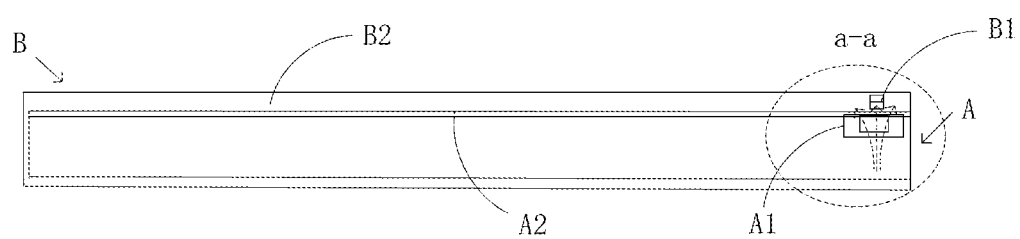
FIG. 2A is a diagram of a sectional structure of a system for protecting electronic equipment with a protective case thereof being in a closed state.
Figure 2B:
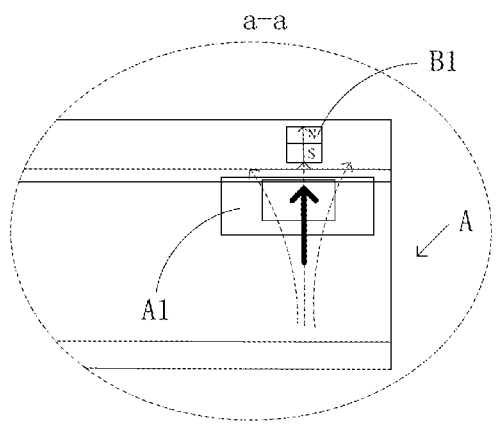
FIG. 2B is a close up view of a part a-a in FIG. 2A.
Figure 3A:
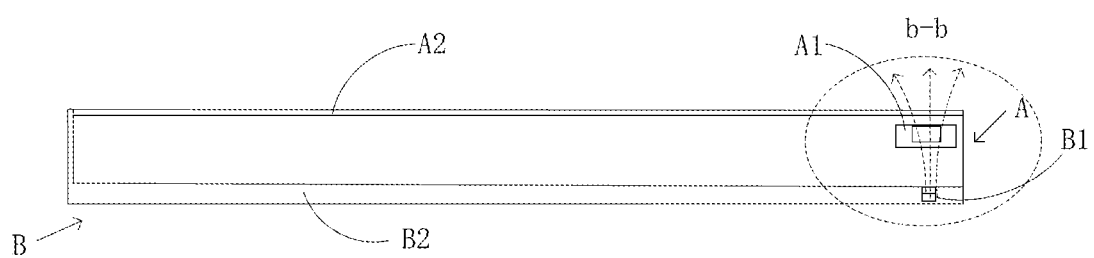
FIG. 3A is a diagram of a sectional structure of a system for protecting electronic equipment with a protective case thereof being in an open state.
Figure 3B:
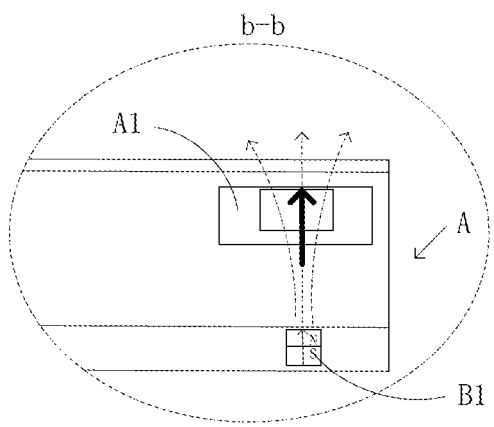
FIG. 3B is a close up view of a part b-b in FIG. 3A.

Exemplary embodiments (examples of which are illustrated in the accompanying drawings) are elaborated below. The following description refers to the accompanying drawings, in which identical or similar elements in two drawings are denoted by identical reference numerals unless indicated otherwise. Implementations set forth in the following exemplary embodiments do not represent all implementations in accordance with the subject disclosure. Rather, they are merely examples of the apparatus and method in accordance with certain aspects herein as recited in the accompanying claims. The exemplary implementation modes may take on multiple forms, and should not be taken as being limited to examples illustrated herein. Instead, by providing such implementation modes, embodiments herein may become more comprehensive and complete, and comprehensive concept of the exemplary implementation modes may be delivered to those skilled in the art. Implementations set forth in the following exemplary embodiments do not represent all implementations in accordance with the subject disclosure. Rather, they are merely examples of the apparatus and method in accordance with certain aspects herein as recited in the accompanying claims.

A term used in an embodiment herein is merely for describing the embodiment instead of limiting the subject disclosure. A singular form "a" and "the" used in an embodiment herein and the appended claims may also be intended to include a plural form, unless clearly indicated otherwise by context. Further note that a term "and/or" used herein may refer to and contain any combination or all possible combinations of one or more associated listed items.

Note that although a term such as first, second, third may be adopted in an embodiment herein to describe various kinds of information, such information should not be limited to such a term. Such a term is merely for distinguishing information of the same type. For example, without departing from the scope of the embodiments herein, the first information may also be referred to as the second information. Similarly, the second information may also be referred to as the first information. Depending on the context, a "if" as used herein may be interpreted as "when" or "while" or "in response to determining that".

In addition, described characteristics, structures or features may be combined in one or more implementation modes in any proper manner. In the following descriptions, many details are provided to allow a full understanding of embodiments herein. However, those skilled in the art will know that the technical solutions of embodiments herein may be carried out without one or more of the details; alternatively, another method, component, device, option, etc., may be adopted. Under other conditions, no detail of a known structure, method, device, implementation, material or operation may be shown or described to avoid obscuring aspects of embodiments herein.

A block diagram shown in the accompanying drawings may be a functional entity which may not necessarily correspond to a physically or logically independent entity. Such a functional entity may be implemented in form of software, in one or more hardware modules or integrated circuits, or in different networks and/or processor devices and/or microcontroller devices.

Electronic equipment, such as a mobile phone or a tablet, may be provided with a magnetic sensor apparatus. The magnetic sensor apparatus may monitor information on an external magnetic field in a designated direction and perform smart trigger of a related function of the electronic equipment. However, a magnetic sensor apparatus that monitors information on a magnetic field in a single direction may be susceptible to interference from an internal magnetic field, an external magnetic field, and the like, leading to inadvertent trigger of a related function of the electronic equipment.

FIG. 1 is a diagram of a structure of electronic equipment according to an exemplary embodiment herein. As shown in FIG. 1, electronic equipment 1 can include an equipment body 11 and a magnetic sensor apparatus 12 assembled to the equipment body 11. The magnetic sensor apparatus 12 can further include a control circuit 122 and at least two magnetic field detectors 121. Any two magnetic field detectors 121 sense a magnetic field respectively in two sensing directions differing from one another. The control circuit 122 is conductively connected to a motherboard 111 of the equipment body 11. The control circuit 122 sends a sensor signal to the motherboard 111 when each magnetic field detector 121 senses external magnetic induction of no less than a preset threshold corresponding to the each magnetic field detector. The motherboard 111 sends a control signal to control the equipment body 11 according to the sensor signal.

The magnetic sensor apparatus 12 is provided with at least two magnetic field detectors 121. Any two magnetic field detectors 121 sense a magnetic field respectively in two different sensing directions. The control circuit 122 sends a sensor signal to the motherboard 111 only when each magnetic field detector 121 senses, in a respective sensing direction, external magnetic induction of no less than a respective preset threshold corresponding to the each magnetic field detector. The motherboard 111 sends a control signal to control the equipment body 11 according to the sensor signal. Therefore, by monitoring magnetic induction in multiple directions, precision in sensing by the magnetic sensor apparatus 12 can be improved, avoiding inadvertent trigger of a function of electronic equipment 1 caused by interference to monitoring of magnetic field intensity in a single direction.

In the embodiment, an external magnetic field associated with the magnetic sensor apparatus 12 may come from external equipment used in coordination with the electronic equipment 1, a protective case 2 used in coordination with the electronic equipment 1, and the like. For example, when the external equipment is at a location in a relation to the location of the electronic equipment that satisfies a preset condition, a magnetic part 211 located in the external equipment may generate magnetic induction with each component in a sensing direction of a respective magnetic field detector 121 of the electronic equipment 1 reaching a corresponding preset threshold. Then, the electronic equipment 1 may be triggered to start a corresponding function.

In another example, when a cover of the protective case 2 is closed, a magnetic part 211 on the cover may generate magnetic induction with each component in a sensing direction of a respective magnetic field detector 121 of the electronic equipment 1 reaching a corresponding preset threshold. Then, the motherboard 111 of the electronic equipment 1 may receive a sensor signal and control to turn off the screen. On the other hand, when the protective case 2 is open, magnetic induction in the sensing direction of at least one magnetic field detector 121 is less than a corresponding preset threshold thereto, the motherboard 111 of the electronic equipment 1 may control to light up the screen for once.

In the embodiment, the magnetic sensor apparatus 12 may be provided in an edge region of the equipment body 11, thus reducing interference to the magnetic sensor apparatus 12 by a magnetic field generated by an electromagnetic component or a circuit internal to the electronic equipment 1, improving sensing precision and sensitivity of the magnetic sensor apparatus 12.

The magnetic sensor apparatus 12 may include two, three, or more magnetic field detectors 121, as required by a specific circumstance to which the magnetic sensor apparatus 12 applies. Sensing directions and judgment precision of the magnetic sensor apparatus 12 may be increased by increasing the number of magnetic field detectors 121. Cost, complexity of the structure, and the like, of the magnetic sensor apparatus 12 may be reduced by decreasing the number of magnetic field detectors 121, and no limit thereto is set herein. The magnetic sensor apparatus 12 may be provided with two magnetic field detectors 121, as shown in exemplary description as follows.

According to an embodiment, at least two magnetic field detectors 121 may sense the magnetic field respectively in two sensing directions perpendicular to one another. For example, the magnetic sensor apparatus 12 may be provided with two magnetic field detectors 121. The two magnetic field detectors 121 may sense the magnetic field respectively in two sensing directions perpendicular to one another. Alternatively, the magnetic sensor apparatus 12 may be provided with three magnetic field detectors 121. The three magnetic field detectors 121 may sense the magnetic field respectively in three sensing directions where two of which are perpendicular to one another. Providing magnetic field detectors 121 with sensing directions perpendicular to one another is easy, and allows reasonable distribution of the sensing directions of the magnetic field detectors 121, improving utilization of each magnetic field detector 121.

Further, at least one magnetic field detector 121 may sense the magnetic field in a sensing direction along a thickness of the electronic equipment 1, to sense and determine magnetic induction in the direction along the thickness the electronic equipment 1. For example, based on how a tablet is commonly held, operated, used, and the like, there may generally be a component of magnetic induction of an external magnetic field in a direction along a thickness of the tablet. It may be appropriate to determine whether the component of magnetic induction in the direction along the thickness is no less than a preset threshold corresponding to that direction.

The magnetic sensor apparatus 12 may include one or more magnetic sensors. Such a magnetic sensor may be a separate integral sensor device such as a Hall magnetic sensor, an Anisotropic Magneto Resistance (AMR) magnetic sensor (which is a magnetic sensor that implements detection using a change in reluctance brought about by the magnetic field in a specific direction), a Giant Magneto Resistive (GMR) magnetic sensor, and the like. Such a magnetic sensor may also be a chip serving to sense the magnetic field in at least one sensing direction. No limit to the form of a magnetic sensor is set herein.

The magnetic sensor apparatus 12 may include one magnetic sensor. The magnetic sensor apparatus 12 may be a Hall magnetic sensor, an AMR magnetic sensor, or a GMR magnetic sensor. The magnetic sensor may include at least two magnetic field detectors 121 with different sensing directions to monitor magnetic induction in different directions, simplifying the structure of the magnetic sensor apparatus 12, improving integration of functions of the magnetic sensor apparatus 12, reducing space occupied by the electronic equipment 1.

Alternatively, the magnetic sensor apparatus 12 may include multiple magnetic sensors. Each magnetic sensor may be provided with at least one magnetic field detector 121. Magnetic induction in different directions may be monitored through association and coordination between the multiple magnetic sensors, improving flexibility in arrangement of the magnetic field detector(s) 121, facilitating assembly and coordination.

Electronic equipment A may be equipped with a protective case B. A magnet B1 may in general be provided on the protective case B. Smart lighting-up and/or turning-off of a screen A2 of the electronic equipment A may be implemented using a change in a magnetic field sensed by a magnetic sensor apparatus A1 at opening and/or closing of the protective case B. The changing location of the magnet B1 at opening and/or closing of the protective case B may complicate circumstance of the magnetic field in the sensing direction of the magnetic sensor apparatus A1, which may cause a misjudgment by the magnetic sensor apparatus A1, thereby causing inadvertent trigger of the screen A2 of the electronic equipment.

For example, FIG. 2A, FIG. 2B, FIG. 3A, and FIG. 3B show two states in use. In one state, a cover B2 of the protective case is closed. In the other state, the cover B2 of the protective case is open and folded to the back of the electronic equipment A. Dashed arrows in the figures schematically show the magnetic field the magnet B1 applies to the magnetic sensor apparatus A1. The thin solid arrow in the magnet B1 indicates the direction of the magnetic field inside the magnet B1. The thick solid arrow on the magnetic sensor apparatus A1 indicates the sensing direction of the magnetic sensor apparatus A1. Magnetic induction sensed by the magnetic sensor apparatus A1 in the direction along the thickness of the electronic equipment A when the cover B2 of the protective case is closed is the same as that sensed by the magnetic sensor apparatus A1 in the direction along the thickness of the electronic equipment A when the cover B2 of the protective case is open and folded to the back of the electronic equipment A, thus causing inadvertent trigger of turning-off of the screen A2.

Figure 4:
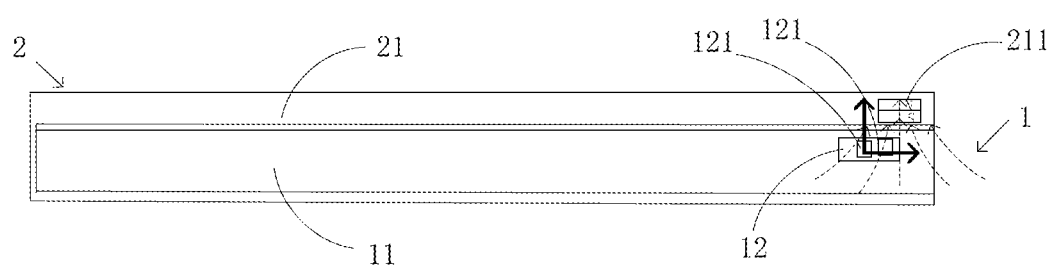
FIG. 4 is a diagram of a sectional structure of a system for protecting electronic equipment according to an exemplary embodiment herein with a protective case thereof being in a closed state.
Figure 5:
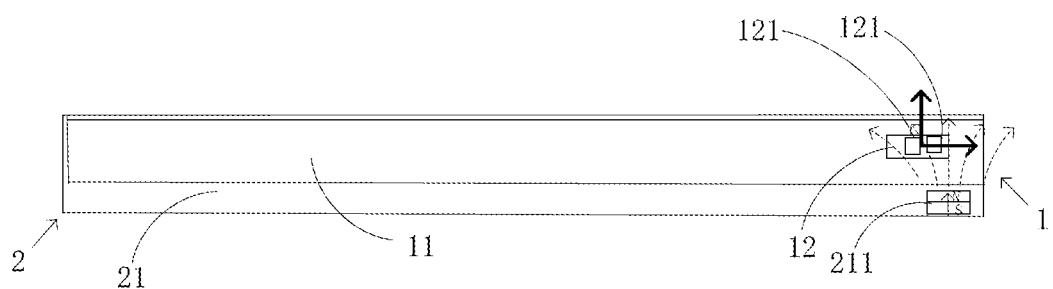
FIG. 5 is a diagram of a sectional structure of a system for protecting electronic equipment according to an exemplary embodiment herein with a protective case thereof being in an open state.

FIG. 4 is a diagram of a sectional structure of a system for protecting electronic equipment according to an exemplary embodiment herein, with a protective case thereof being in a closed state. FIG. 5 is a diagram of a sectional structure of a system for protecting electronic equipment according to an exemplary embodiment herein, with a protective case thereof being in an open state. As shown in FIG. 4 and FIG. 5, the system for protecting electronic equipment 1 includes a protective case 2 and the electronic equipment 1. The protective case 2 includes a movable cover 21. The electronic equipment 1 is arranged in the protective case 2. The movable cover 21 is in a state including a closed state and an open state. The movable cover 21 in the closed state covers a preset side of the equipment body 11.

Considering an example where the magnetic sensor apparatus 12 includes two magnetic field detectors 121. In FIG. 4 and FIG. 5, dashed arrows may represent magnetic induction lines applied to the magnetic sensor apparatus 12. The thin solid arrow in a magnetic part 211 may indicate the direction of the magnetic field inside the magnetic part 211. The thick solid arrows on the magnetic sensor apparatus 12 may indicate the sensing directions of the two magnetic field detectors 121 of the magnetic sensor apparatus 12. The movable cover 21 in the open state is away from the preset side of the equipment body 11. The magnetic part 211 is provided at a location of the movable cover 21 corresponding to the magnetic sensor apparatus. A magnetic induction of a magnetic field of the magnetic part 211 in a sensing direction of each magnetic field detector 121 is no less than the preset threshold corresponding to the each magnetic field detector when the movable cover 21 is in the closed state. The magnetic induction of the magnetic field of the magnetic part 211 in a sensing direction of at least one magnetic field detector 121 is less than the preset threshold corresponding to the at least one magnetic field detector when the movable cover 21 is in the open state.

Electronic equipment 1 and a magnetic sensor apparatus 12 thereof are provided with a structure according to the embodiment, which is not repeated here. The magnetic sensor apparatus 12 includes at least two magnetic field detectors 121. The at least two magnetic field detectors 121 sense a magnetic field respectively in different sensing directions. A control circuit 122 sends a sensor signal to a motherboard 111 when a magnetic part 211 located on a protective case 2 applies, to each magnetic field detector 121 in a respective sensing direction of the each magnetic field detector, magnetic induction no less than a preset threshold corresponding to the each magnetic field detector. The motherboard 111 sends a control signal to control the equipment body 11 according to the sensor signal. Accordingly, the magnetic part 211 may apply its magnetic field to a different location when a movable cover 21 of the protective case 2 is flipped. By monitoring magnetic induction in multiple directions, precision in sensing by the magnetic sensor apparatus 12 is improved, avoiding inadvertent trigger of a function of electronic equipment 1 caused by monitoring of magnetic field intensity in but one direction, as well as improving experience in using the protective case 2.

When the movable cover 21 is in the closed state, precision in sensing by the magnetic sensor apparatus 12 may depend on a relation between the location of the magnetic part 211 and the location of the magnetic sensor apparatus 12, as well as a relation between the orientation of the magnetic field of the magnetic part 211 and the respective sensing direction of each magnetic field detector 121. By way of example, the magnetic part 211 may be provided as follows.

According to an embodiment, the magnetic field internal to the magnetic part 21 may be oriented at a preset angle to a sensing direction of any magnetic field detector 121 when the movable cover 21 is in the closed state. Based on the way in which the magnetic part 211 is provided, when the movable cover 21 is in the closed state, there may be components of the magnetic field of the magnetic part 211 in sensing directions of at least two magnetic field detectors 121. By determining whether values of magnetic induction in both sensing directions are no less than the preset thresholds, precision in sensing by the magnetic sensor apparatus 12 may be improved, avoiding inadvertent trigger by a magnetic field caused by a change in the location of the movable cover 21.

The preset angle may be an acute angle, an obtuse angle, or a right angle, and no limit thereto is set herein.

According to an embodiment, the magnetic field internal to the magnetic part 211 may be oriented parallel to a sensing direction of any magnetic field detector 121 when the movable cover 21 is in the closed state. The location of the magnetic part 211 may deviate from that of the magnetic field detector 121 in a parallel direction due to the structure.

The deviation in the locations may lead to components of magnetic induction of the magnetic field of the magnetic part 211 respectively in at least the sensing direction of the magnetic field detector 121 and the sensing direction of a second magnetic field detector 121 perpendicular to the sensing direction of the magnetic field detector 121. By determining whether values of magnetic induction in both sensing directions are no less than the preset thresholds, precision in sensing by the magnetic sensor apparatus 12 may be improved, avoiding inadvertent trigger caused by a change in the location of the movable cover 21.

The magnetic part 211 may be provided inside the movable cover 21. The magnetic part may be embedded inside or outside the movable cover 21. No limit thereto is set herein. The magnetic part 211 may be a bar magnet, a horseshoe magnet, a cylindrical magnet, and the like. No limit thereto is set herein.

For example, the magnetic part 211 may be a bar magnet. The magnetic sensor apparatus 12 of electronic equipment 1 may include two magnetic field detectors 121. The two magnetic field detectors 121 may sense the magnetic field respectively in two sensing directions perpendicular to one another. For example, one magnetic field detector 121 may sense the magnetic field in the direction along the thickness the electronic equipment 1. The magnetic field inside the bar magnet may be parallel or perpendicular to the direction along the thickness of the electronic equipment 1.

As shown in FIG. 4, the magnetic field internal to the bar magnet may be oriented parallel to the direction along the thickness of the electronic equipment 1. The magnetic field internal to the bar magnet may be oriented parallel to the sensing direction of one magnetic field detector 121. The sensing direction of the one magnetic field detector 121 may be along the thickness of the electronic equipment 1. That is, an axis of the bar magnet along the magnetic field internal to the bar magnet may deviate, by a distance, from an axis of the magnetic field detector 121 along the sensing direction perpendicular to the thickness of the electronic equipment 1. When the movable cover 21 is in the closed state, the deviate distance may lead to components of magnetic induction of the magnetic field of the bar magnet respectively in at least the sensing direction of the magnetic field detector 121 and the sensing direction of the other magnetic field detector 121 perpendicular to the sensing direction of the magnetic field detector 121. By monitoring magnetic induction in both directions, it is ensured that the magnetic field of the bar magnet cannot trigger sending of a sensor signal to the motherboard 111 by the magnetic sensor apparatus 12 no matter where the movable cover is located as long as it is in the open state, avoiding inadvertent trigger of the electronic equipment 1.

Figure 6:
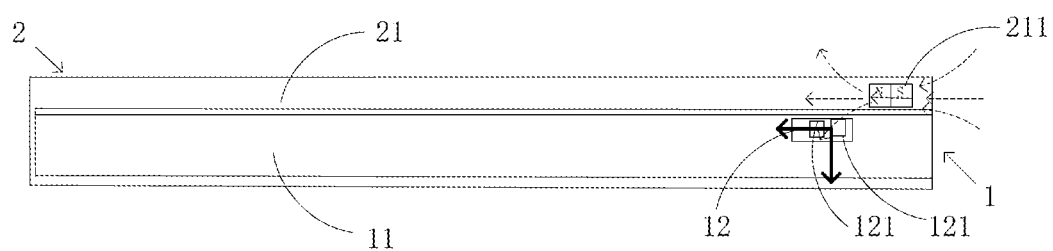
FIG. 6 is a diagram of a sectional structure of a system for protecting electronic equipment according to an exemplary embodiment herein with a protective case thereof being in a closed state.

As shown in FIG. 6, the magnetic field internal to the bar magnet may be oriented perpendicular to the direction along the thickness of the electronic equipment 1. An axis of the bar magnet perpendicular to the magnetic field internal to the bar magnet may be oriented parallel to the sensing direction of one magnetic field detector 121. The sensing direction of the one magnetic field detector 121 may be along the thickness the electronic equipment 1. That is, the axis of the bar magnet perpendicular to the magnetic field internal to the bar magnet may deviate, by a distance, from an axis of the magnetic field detector 121 along the sensing direction perpendicular to the thickness of the electronic equipment 1. For example, the magnetic sensor apparatus 12 may include two magnetic field detectors 121.

In FIG. 6, dashed arrows may represent magnetic induction lines applied to the magnetic sensor apparatus 12. The thin solid arrows in the magnetic part 211 may indicate the direction of the magnetic field internal to the magnetic part 211. The thick solid arrows on the magnetic sensor apparatus 12 may indicate the sensing directions of the two magnetic field detectors 121 of the magnetic sensor apparatus 12. When the movable cover 21 is in the closed state, the deviate distance may lead to components of magnetic induction of the magnetic field of the bar magnet respectively in at least the sensing direction of the magnetic field detector 121 and the sensing direction of the other magnetic field detector 121 perpendicular to the sensing direction of the magnetic field detector 121. By monitoring magnetic induction in both directions, it is ensured that the magnetic field of the bar magnet cannot trigger sending of a sensor signal to the motherboard 111 by the magnetic sensor apparatus 12 no matter where the movable cover is located as long as it is in the open state, avoiding inadvertent trigger of the electronic equipment 1.

Figure 7:
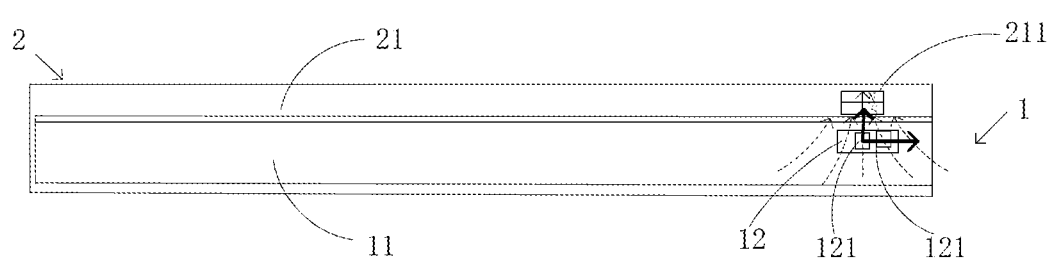
FIG. 7 is a diagram of a sectional structure of a system for protecting electronic equipment according to an exemplary embodiment herein with a protective case thereof being in a closed state.

According to an exemplary embodiment, the magnetic sensor apparatus 12 may include two magnetic field detectors 121. As shown in FIG. 7, dashed arrows may represent magnetic induction lines applied to the magnetic sensor apparatus 12. The thin solid arrows in the magnetic part 211 may indicate the direction of the magnetic field internal to the magnetic part 211. The thick solid arrows on the magnetic sensor apparatus 12 may indicate the sensing directions of the two magnetic field detectors 121 of the magnetic sensor apparatus 12. An axis of the magnetic part 211 along the magnetic field internal to the magnetic part may coincide with an axis of any one magnetic field detector 121 along a sensing direction of the any one magnetic field detector when the movable cover 21 is in the closed state. Even if the axis of the magnetic part 211 along the magnetic field internal to the magnetic part coincides with the axis of any one magnetic field detector 121 along the sensing direction of the any one magnetic field detector, with at least two magnetic field detectors 121 of different sensing directions, it may still be determined whether magnetic induction is no less than a preset threshold using a magnetic field detector 121 of another sensing direction, thereby improving precision in sensing by the magnetic sensor apparatus 12, avoiding inadvertent trigger caused by a change in the location of the movable cover 21.

The magnetic part 211 may be a bar magnet, a horseshoe magnet, a cylindrical magnet, etc. No limit thereto is set herein.

In addition, the electronic equipment 1 may include multiple magnetic sensor apparatuses 12. The movable cover 21 may be provided with multiple magnetic parts 211. The multiple magnetic parts 211 may be in one-to-one correspondence with the magnetic sensor apparatuses 12. The multiple magnetic sensor apparatuses 12 may serve different sensing functions, respectively. The multiple magnetic sensor apparatuses may as well be associated with one another to implement one sensing function. No limit thereto is set herein. The multiple magnetic sensor apparatuses 12 may serve different sensing functions respectively, enriching functionality of the electronic equipment 1. The multiple magnetic sensor apparatuses 12 may be associated with one another to implement one sensing function, improving precision of the sensing function, avoiding inadvertent trigger, and the like.

The electronic equipment 1 may be a mobile phone, an on-board user equipment, a tablet computer, a medical user equipment, and the like. No limit thereto is set herein.

A method for controlling electronic equipment is provided according to an aspect of the subject disclosure. The electronic equipment includes an equipment body and a magnetic sensor apparatus assembled to the equipment body. The magnetic sensor apparatus includes a control circuit and at least two magnetic field detectors. Any two of the at least two magnetic field detectors sense a magnetic field respectively in two sensing directions differing from one another. The control circuit is conductively connected to a motherboard of the equipment body.

The method includes sending, by the control circuit, a sensor signal to the motherboard in response to determining that external magnetic induction sensed by each of the at least two magnetic field detectors is no less than a preset threshold corresponding to the each of the at least two magnetic field detectors, and sending, by the motherboard, a control signal to control the equipment body according to the sensor signal.

According to an aspect of the subject disclosure, a non-transitory computer-readable storage medium has stored thereon instructions that, when executed by a processor, cause the processor to implement a method for controlling electronic equipment. The electronic equipment includes an equipment body and a magnetic sensor apparatus assembled to the equipment body. The magnetic sensor apparatus includes a control circuit and at least two magnetic field detectors. Any two of the at least two magnetic field detectors sense a magnetic field respectively in two sensing directions differing from one another. The control circuit is conductively connected to a motherboard of the equipment body.

The method includes, sending, by the control circuit, a sensor signal to the motherboard in response to determining that external magnetic induction sensed by each of the at least two magnetic field detectors is no less than a preset threshold corresponding to the each of the at least two magnetic field detectors, and sending, by the motherboard, a control signal to control the equipment body according to the sensor signal.

Figure 8:
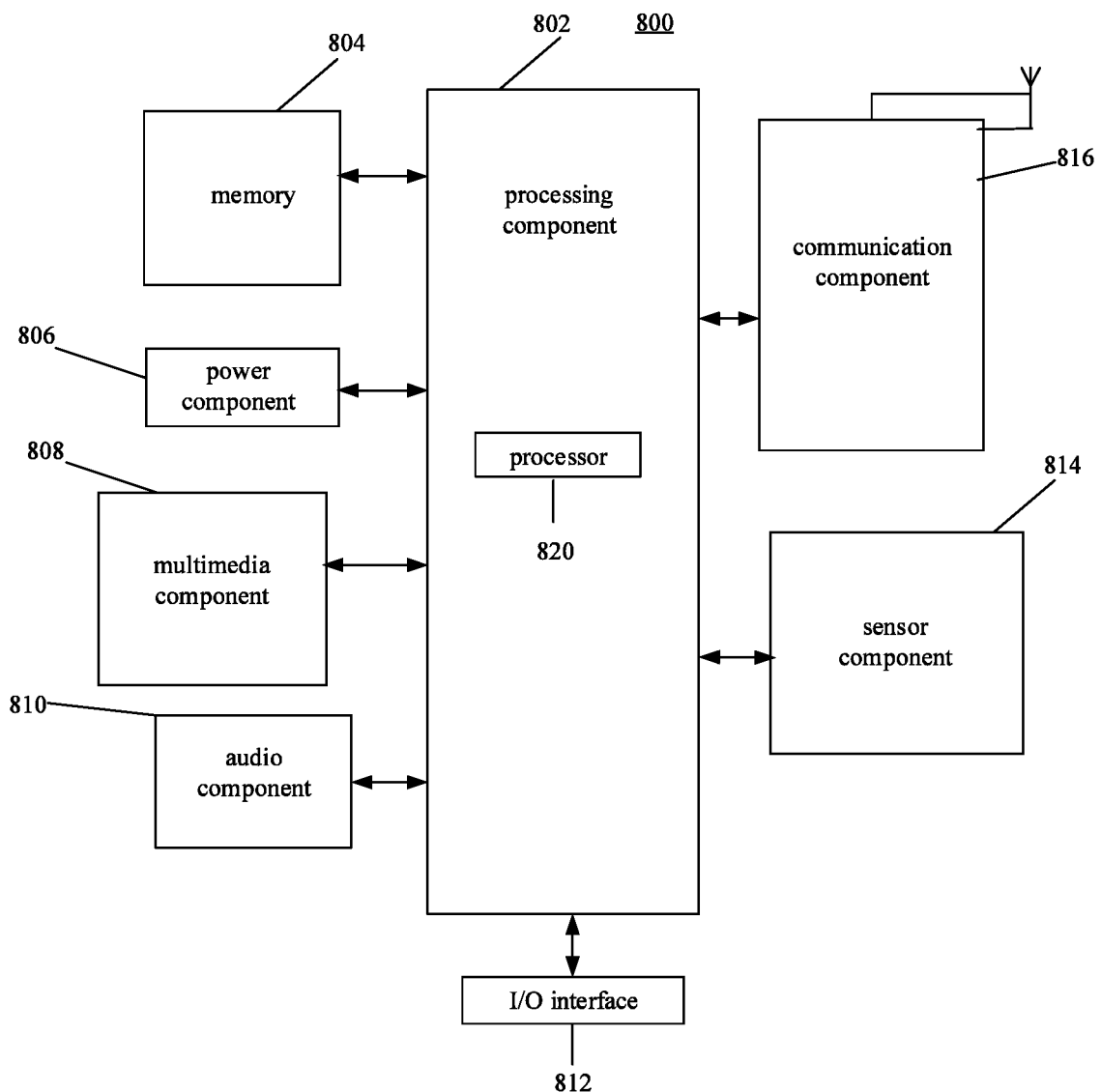
FIG. 8 is a diagram of a structure of electronic equipment according to an exemplary embodiment herein.

FIG. 8 is a diagram of a structure of electronic equipment according to an exemplary embodiment herein. For example, the electronic equipment 800 may be a mobile phone, a computer, a digital broadcast UE, a messaging device, a gaming console, a tablet, a medical device, exercise equipment, a personal digital assistant, and the like.

Referring to FIG. 8, the electronic equipment 800 may include at least one of a processing component 802, memory 804, a power component 806, a multimedia component 808, an audio component 810, an Input/Output (I/O) interface 812, a sensor component 814, or a communication component 816.

The processing component 802 may generally control an overall operation of the electronic equipment 800, such as operations associated with display, a telephone call, data communication, a camera operation, a recording operation, and the like. The processing component 802 may include one or more processors 820 to execute instructions so as to complete all or a part of an aforementioned method. In addition, the processing component 802 may include one or more portions to facilitate interaction between the processing component 802 and other components. For example, the processing component 802 may include a multimedia portion to facilitate interaction between the multimedia component 808 and the processing component 802.

The memory 804 may be adapted to storing various types of data to support the operation at the electronic equipment 800. Examples of such data may include instructions of any application or method adapted to operating on the electronic equipment 800, contact data, phonebook data, messages, pictures, videos, and the like. The memory 804 may be realized by any type of transitory or non-transitory storage equipment or a combination thereof, such as Static Random Access Memory (SRAM), Electrically Erasable Programmable Read-Only Memory (EEPROM), Erasable Programmable Read-Only Memory (EPROM), Programmable Read-Only Memory (PROM), Read-Only Memory (ROM), magnetic memory, flash memory, a magnetic disk, a compact disk, and the like.

The power component 806 may supply electric power to various components of the electronic equipment 800. The power component 806 may include a power management system, one or more power sources, and other components related to generating, managing, and distributing electricity for the electronic equipment 800.

The multimedia component 808 may include a screen that provides an output interface between the electronic equipment 800 and a user. The screen may include a Liquid Crystal Display (LCD), a Touch Panel (TP), and the like. If the screen includes a TP, the screen may be realized as a touch screen to receive a signal input by a user. The TP may include one or more touch sensors for sensing touch, slide, and gestures on the TP. The one or more touch sensors not only may sense the boundary of a touch or slide move, but also detect the duration and pressure related to the touch or slide move. The multimedia component 808 may include at least one of a front camera or a rear camera. When the electronic equipment 800 is in an operation mode such as a photographing mode or a video mode, at least one of the front camera or the rear camera may receive external multimedia data. Each of the front camera or the rear camera may be a fixed optical lens system or may have a focal length and be capable of optical zooming.

The audio component 810 may be adapted to outputting and/or inputting an audio signal. For example, the audio component 810 may include a microphone (MIC). When the electronic equipment 800 is in an operation mode such as a call mode, a recording mode, a voice recognition mode, and the like, the MIC may be adapted to receiving an external audio signal. The received audio signal may be further stored in the memory 804 or may be sent via the communication component 816. The audio component 810 may further include a loudspeaker adapted to outputting the audio signal.

The I/O interface 812 may provide an interface between the processing component 802 and a peripheral interface portion. Such a peripheral interface portion may be a keypad, a click wheel, a button, and the like. Such a button may include but is not limited to at least one of a homepage button, a volume button, a start button, or a lock button.

The sensor component 814 may include one or more sensors for assessing various states of the electronic equipment 800. For example, the sensor component 814 may detect an on/off state of the electronic equipment 800 and relative positioning of components such as the display and the keypad of the electronic equipment 800. The sensor component 814 may further detect a change in the position of the electronic equipment 800 or of a component of the electronic equipment 800, whether there is contact between the electronic equipment 800 and a user, the orientation or acceleration/deceleration of the electronic equipment 800, a change in the temperature of the electronic equipment 800, and the like. The sensor component 814 may include a proximity sensor adapted to detecting existence of a nearby object without physical contact. The sensor component 814 may further include an optical sensor such as a Complementary Metal-Oxide-Semiconductor (CMOS) or a Charge-Coupled-Device (CCD) image sensor used in an imaging application. The sensor component 814 may further include an acceleration sensor, a gyroscope sensor, a magnetic sensor, a pressure sensor, a temperature sensor, and the like.

The communication component 816 may be adapted to facilitating wired or wireless communication between the electronic equipment 800 and other equipment. The electronic equipment 800 may access a wireless network based on a communication standard such as Wi-Fi, 2G, 3G . . . , or a combination thereof. The communication component 816 may broadcast related information or receive a broadcast signal from an external broadcast management system via a broadcast channel. The communication component 816 may include a Near Field Communication (NFC) portion for short-range communication. For example, the NFC portion may be based on technology such as Radio Frequency Identification (RFID), Infrared Data Association (IrDA), Ultra-Wideband (UWB) technology, Bluetooth (BT), and the like.

The electronic equipment 800 may be realized by one or more electronic components such as an Application Specific Integrated Circuit (ASIC), a Digital Signal Processor (DSP), a Digital Signal Processing Device (DSPD), a Programmable Logic Device (PLD), a Field Programmable Gate Array (FPGA), a controller, a microcontroller, a microprocessor, and the like, to implement an aforementioned method.

A non-transitory computer-readable storage medium including instructions, such as memory 804 including instructions, may be provided. The instructions may be executed by the processor 820 of the electronic equipment 800 to implement an aforementioned method. For example, the non-transitory computer-readable storage medium may be Read-Only Memory (ROM), Random Access Memory (RAM), Compact Disc Read-Only Memory (CD-ROM), a magnetic tape, a floppy disk, optical data storage equipment, and the like.

The processor may be a Central Processing Unit (CPU), a general purpose processor, a Digital Signal Processor (DSP), an Application Specific Integrated Circuit (ASIC), and/or the like. A general purpose processor may be a microprocessor, any conventional processor, and/or the like. Aforementioned memory may be a Read-Only Memory (ROM), a Random Access Memory (RAM), a flash memory, a hard disk, a solid state disk, and/or the like. A Subscriber Identity Module (SIM) card, also referred to as a smart card, may have to be installed on a digital mobile phone before the phone can be used. Content, such as information on a user of the digital mobile phone, an encryption key, a phonebook of the user, may be stored on the computer chip. An option of the method according to any combination of embodiments herein may be executed by a hardware processor, or by a combination of hardware and software modules in the processor.

Herein by "multiple", it may mean two or more. A term "and/or" may describe an association between associated objects, including three possible relationships. For example, by A and/or B, it may mean that there may be three cases, namely, existence of but A, existence of both A and B, or existence of but B. A slash mark "/" may generally denote an "or" relationship between two associated objects that come respectively before and after the mark per se.

Other embodiments according to the subject disclosure will be apparent to one skilled in the art after they have considered the subject disclosure and practiced the solution disclosed herein. The subject application is intended to cover any variation, use, or adaptation of the subject disclosure following the general principle of the subject disclosure and including such departures from the subject disclosure as come within knowledge or customary practice in the art. The subject disclosure and its embodiments are intended to be exemplary only, with a true scope and spirit of the subject disclosure being indicated by the appended claims.

It should be understood that subject disclosure is not limited to the exact construction that has been described above and illustrated in the accompanying drawings. Various modifications and changes can be made without departing from the scope of the subject disclosure. It is intended that the scope of the subject disclosure be limited only by the appended claims.

What is claimed is:

1. An apparatus, comprising:
an electronic equipment; and
a protective case, the electronic equipment being arranged in the protective case,
wherein
the electronic equipment includes:
  equipment body including a motherboard;
  a magnetic sensor apparatus assembled to the equipment body, the magnetic sensor apparatus having at least two magnetic field detectors that are configured to sense a magnetic field respectively in two sensing directions perpendicular to one another, one of the at least two magnetic field detectors being configured to sense the magnetic field in a thickness direction of the electronic equipment; and
  a control circuit that is coupled to the motherboard of the equipment body, the control circuit being configured to send a sensor signal to the motherboard in response to determining that an external magnetic induction sensed by each of the at least two magnetic field detectors is no less than a preset threshold corresponding to the each of the at least two magnetic field detectors, the motherboard being configured to send a control signal to control the equipment body according to the sensor signal,
the protective case includes:
  a movable cover configured to be movable between a closed state and an open state, the movable cover covering a preset side of the equipment body when the movable cover is in the closed state, and the movable cover being away from the preset side of the equipment body when the movable cover is in the open state,
the movable cover includes a magnetic part that is a bar magnet provided at a location corresponding to the magnetic sensor apparatus,
a magnetic induction of the magnetic field of the magnetic part in a sensing direction of the each of the at least two magnetic field detectors is no less than the preset threshold corresponding to the each of the at least two magnetic field detectors in response to the movable cover being in the closed state,
the magnetic induction of the magnetic field of the magnetic part in a sensing direction of at least one of the at least two magnetic field detectors is less than the preset threshold corresponding to the at least one of the at least two magnetic field detectors in response to the movable cover being in the open state,
the magnetic field internal to the magnetic part is oriented parallel to a sensing direction of one of the at least two magnetic field detectors in response to the movable cover being in the closed state,
the magnetic field internal to the bar magnet is oriented parallel or perpendicular to the thickness direction of the electronic equipment,
an axis of the bar magnet parallel to the thickness direction of the electronic equipment deviates, by a deviate distance along a direction perpendicular to the thickness direction of the electronic equipment, from an axis of the at least two magnetic field detectors corresponding to the sensing direction along the thickness direction of the electronic equipment, and
the deviate distance is arranged to cause, when the movable cover is in the closed state, components of the magnetic induction of the magnetic field of the bar magnet respectively in at least the sensing direction along the thickness direction of the electronic equipment, and a sensing direction perpendicular to the thickness direction of the electronic equipment.

2. The apparatus of claim 1, wherein the electronic equipment comprises a plurality of magnetic sensor apparatuses and the movable cover is provided with a plurality of magnetic parts in one-to-one correspondence with the magnetic sensor apparatuses.

3. A method for controlling electronic equipment arranged in a protective case, the electronic equipment including an equipment body and a magnetic sensor apparatus assembled to the equipment body, the magnetic sensor apparatus having a control circuit and at least two magnetic field detectors that sense a magnetic field respectively in two sensing directions perpendicular to one another, the control circuit being conductively connected to a motherboard of the equipment body, and the method comprising:
  sending, by the control circuit, a sensor signal to the motherboard in response to determining that external magnetic induction sensed by each of the at least two magnetic field detectors is no less than a preset threshold corresponding to the each of the at least two magnetic field detectors; and
  sending, by the motherboard, a control signal to control the equipment body according to the sensor signal,
wherein
one of the at least two magnetic field detectors being configured to sense the magnetic field in a thickness direction of the electronic equipment,
the protective case includes:
  a movable cover configured to be movable between a closed state and an open state, the movable cover covering a preset side of the equipment body when the movable cover is in the closed state, and the movable cover being away from the preset side of the equipment body when the movable cover is in the open state,
the movable cover includes a magnetic part that is a bar magnet provided at a location corresponding to the magnetic sensor apparatus,
a magnetic induction of the magnetic field of the magnetic part in a sensing direction of the each of the at least two magnetic field detectors is no less than the preset threshold corresponding to the each of the at least two magnetic field detectors in response to the movable cover being in the closed state,
the magnetic induction of the magnetic field of the magnetic part in a sensing direction of at least one of the at least two magnetic field detectors is less than the preset threshold corresponding to the at least one of the at least two magnetic field detectors in response to the movable cover being in the open state, the magnetic field internal to the magnetic part is oriented parallel to a sensing direction of one of the at least two magnetic field detectors in response to the movable cover being in the closed state, the magnetic field internal to the bar magnet is oriented parallel or perpendicular to the thickness direction of the electronic equipment, an axis of the bar magnet parallel to the thickness direction of the electronic equipment deviates, by a deviate distance along a direction perpendicular to the thickness direction of the electronic equipment, from an axis of the at least two magnetic field detectors corresponding to the sensing direction along the thickness direction of the electronic equipment, and the deviate distance is arranged to cause, when the movable cover is in the closed state, components of the magnetic induction of the magnetic field of the bar magnet respectively in at least the sensing direction along the thickness direction of the electronic equipment, and a sensing direction perpendicular to the thickness direction of the electronic equipment.

4. The method of claim 3, wherein the magnetic sensor apparatus is a Hall magnetic sensor, an Anisotropic Magneto Resistance (AMR) magnetic sensor, or a Giant Magneto Resistive (GMR) magnetic sensor.

5. The method of claim 3, wherein the magnetic sensor apparatus comprises multiple magnetic sensors and each of the multiple magnetic sensors is provided with at least one of the at least two magnetic field detectors.

6. The method of claim 3, wherein the magnetic sensor apparatus is provided in an edge region of the equipment body.

7. A non-transitory computer-readable storage medium having stored thereon instructions that, when executed by a processor, cause the processor to implement a method for controlling electronic equipment arranged in a protective case, the electronic equipment including an equipment body and a magnetic sensor apparatus assembled to the equipment body, the magnetic sensor apparatus having a control circuit and at least two magnetic field detectors that sense a magnetic field respectively in two sensing directions perpendicular to one another, the control circuit being conductively connected to a motherboard of the equipment body, and the method comprising:

sending, by the control circuit, a sensor signal to the motherboard in response to determining that external magnetic induction sensed by each of the at least two magnetic field detectors is no less than a preset threshold corresponding to the each of the at least two magnetic field detectors; and sending, by the motherboard, a control signal to control the equipment body according to the sensor signal, wherein one of the at least two magnetic field detectors being configured to sense the magnetic field in a thickness direction of the electronic equipment, the protective case includes:

a movable cover configured to be movable between a closed state and an open state, the movable cover covering a preset side of the equipment body when the movable cover is in the closed state, and the movable cover being away from the preset side of the equipment body when the movable cover is in the open state, the movable cover includes a magnetic part that is a bar magnet provided at a location corresponding to the magnetic sensor apparatus, a magnetic induction of the magnetic field of the magnetic part in a sensing direction of the each of the at least two magnetic field detectors is no less than the preset threshold corresponding to the each of the at least two magnetic field detectors in response to the movable cover being in the closed state, the magnetic induction of the magnetic field of the magnetic part in a sensing direction of at least one of the at least two magnetic field detectors is less than the preset threshold corresponding to the at least one of the at least two magnetic field detectors in response to the movable cover being in the open state, the magnetic field internal to the magnetic part is oriented parallel to a sensing direction of one of the at least two magnetic field detectors in response to the movable cover being in the closed state, the magnetic field internal to the bar magnet is oriented parallel or perpendicular to the thickness direction of the electronic equipment, an axis of the bar magnet parallel to the thickness direction of the electronic equipment deviates, by a deviate distance along a direction perpendicular to the thickness direction of the electronic equipment, from an axis of the at least two magnetic field detectors corresponding to the sensing direction along the thickness direction of the electronic equipment, and the deviate distance is arranged to cause, when the movable cover is in the closed state, components of the magnetic induction of the magnetic field of the bar magnet respectively in at least the sensing direction along the thickness direction of the electronic equipment, and a sensing direction perpendicular to the thickness direction of the electronic equipment.

8. The apparatus of claim 1, wherein the magnetic sensor apparatus is a Hall magnetic sensor, an Anisotropic Magneto Resistance (AMR) magnetic sensor, or a Giant Magneto Resistive (GMR) magnetic sensor.

9. The apparatus of claim 1, wherein the magnetic sensor apparatus comprises multiple magnetic sensors, wherein each of the multiple magnetic sensors is provided with at least one of the at least two magnetic field detectors.

10. The apparatus of claim 1, wherein the magnetic sensor apparatus is provided in an edge region of the equipment body.

* * * * *